United States Patent
Liu et al.

(10) Patent No.: US 6,563,733 B2
(45) Date of Patent: May 13, 2003

(54) MEMORY ARRAY ARCHITECTURES BASED ON A TRIPLE-POLYSILICON SOURCE-SIDE INJECTION NON-VOLATILE MEMORY CELL

(75) Inventors: Chun-Mai Liu, San Jose, CA (US); Albert Kordesch, San Jose, CA (US); Ming-Bing Chang, Santa Clara, CA (US)

(73) Assignee: Winbond Electronics Corporation, Hsinchu (TW)

( * ) Notice: Subject to any disclaimer, the term of this patent is extended or adjusted under 35 U.S.C. 154(b) by 0 days.

(21) Appl. No.: 09/866,537

(22) Filed: May 24, 2001

(65) Prior Publication Data

US 2003/0034510 A1 Feb. 20, 2003

(51) Int. Cl.[7] .............................................. G11C 16/04
(52) U.S. Cl. .............................. 365/185.1; 365/185.01; 365/185.11; 257/239; 257/261
(58) Field of Search ................................. 257/239, 261, 257/298, 315–326, 409, 490, 495; 438/140, 201, 211, 216, 241, 257, 260, 266, 454, 593

(56) References Cited

U.S. PATENT DOCUMENTS

| | | | | |
|---|---|---|---|---|
| 4,462,090 A | | 7/1984 | Iizuka | |
| 5,432,737 A | * | 7/1995 | Yoneda | 365/185.14 |
| 5,717,636 A | * | 2/1998 | Dallabora et al. | 365/185.06 |
| 5,973,956 A | | 10/1999 | Blyth et al. | |
| 6,002,152 A | * | 12/1999 | Guterman et al. | 257/316 |
| 2001/0028080 A1 | * | 3/2001 | Himeno et al. | 257/315 |

* cited by examiner

Primary Examiner—David Nelms
Assistant Examiner—Long Tran
(74) Attorney, Agent, or Firm—Townsend and Townsend and Crew LLP

(57) ABSTRACT

A semiconductor memory includes a plurality of memory cells arranged along rows and columns, each cell having a floating gate, a drain region, a source region, a program gate terminal, and a select gate terminal. The program gate terminals of the cells along each row of cells are connected together forming a continuous program gate line. The select gate terminals of the cells along each row of cells are connected together forming a continuous select gate line. The source regions of the cells along each row of cells are connected together forming a continuous source line. The cells along each column are divided into a predesignated number of groups, and the drain regions of the cells in each group are connected to a local bitline extending across the cells in the group of cells. A global bitline extends along every two columns of cells, and is configured to selectively provide electrical connection to the local bitlines along the corresponding two columns of cells. The floating gate of each cell is from a first layer polysilicon, the program gate lines are from a second polysilicon layer, the select gate lines are from a third polysilicon layer, and the source lines are diffusion lines.

25 Claims, 5 Drawing Sheets

MEMORY ARRAY ARCHITECTURES BASED ON A TRIPLE-POLYSILICON SOURCE-SIDE INJECTION NON-VOLATILE MEMORY CELL

BACKGROUND OF THE INVENTION

There are many examples of floating gate digital memories, whereby the threshold voltage of the floating gate transistors is changed by significant amounts, in the order of a few volts. One logic state is represented by a wide range of thresholds and the other logic state(s) is represented by a different range(s) of thresholds. Information is read from the cell generally by determining whether the transistor conducts or does not conduct when the transistor is biased into a predetermined read condition.

Analog storage, on the other hand, requires that small or continuous changes be made to the threshold of the floating gate transistor, and requires that the reading of the transistor give a determination of an actual voltage from the transistor, or an indication of how conductive the transistor is. Examples of analog storage can be found in U.S. Pat. No. 4,627,027 (Rai), U.S. Pat. No. 4,890,259 (Simko), 4,989,179 (Simko), U.S. Pat. No. 5,220,531 (Blyth), U.S. Pat. No. 5,241,494 (Blyth), U.S. Pat. No. 5,294,819 (Simko), and U.S. Pat. No. 5,973,956 (Blyth).

The present invention provides a means by which an analog storage array configuration and a digital storage array configuration are produced from the same cell technology.

SUMMARY OF THE INVENTION

In accordance with the present invention, a semiconductor memory includes a plurality of memory cells arranged along rows and columns, each cell having a floating gate, a drain region, a source region, a program gate terminal, and a select gate terminal. The program gate terminals of the cells along each row of cells are connected together forming a continuous program gate line. The select gate terminals of the cells along each row of cells are connected together forming a continuous select gate line. The source regions of the cells along each row of cells are connected together forming a continuous source line. The cells along each column are divided into a predesignated number of groups, and the drain regions of the cells in each group are connected to a local bitline extending across the cells in the group of cells. A global bitline extends along every two columns of cells, and is configured to selectively provide electrical connection to the local bitlines along the corresponding two columns of cells. The floating gate of each cell is from a first layer polysilicon, the program gate lines are from a second polysilicon layer, the select gate lines are from a third polysilicon layer, and the source lines are diffusion lines.

In one embodiment, the local bitlines are from a first layer metal and the global bitlines are from a second layer metal.

In another embodiment, the cells coupled to a row of local bitlines form a segment block, and the memory further includes a first plurality of interconnect lines in each segment block, each interconnect line electrically connecting together the source lines within each segment block. Each of a second plurality of interconnect lines in each segment block electrically connects the program gate lines within each segment block. The first and second plurality of interconnect lines are from first layer metal.

In another embodiment, the memory further includes a first horizontally extending interconnect line in each segment block, electrically connecting the first plurality of interconnect lines. A second horizontally extending interconnect line in each segment block electrically connects the second plurality of interconnect lines together. The first and second horizontally extending interconnect lines are from first layer metal.

In another embodiment, each segment block has first and second rows of segment select transistors, the first row of segment select transistors providing electrical connection between the global bitlines and one half of the local bitlines in the segment block when selected, and the second row of segment select transistors providing electrical connection between the global bitlines and the remaining half of the local bitlines in the segment block when selected.

In another embodiment, a gate terminal of each of the segment select transistors in the first row of segment select transistors are connected together forming a first continuous segment select line, and a gate terminal of each of the segment select transistors in the second row of segment select transistors are connected together forming a second continuous segment select line. The first and second segment select lines are from third layer polysilicon.

In accordance with another embodiment of the present invention, a semiconductor memory includes a plurality of memory cells arranged along rows and columns, each cell having a floating gate, a drain region, a source region, a program gate terminal, and a select gate terminal. The program gate terminals of the cells along each row of cells are connected together forming a continuous program gate line. The select gate terminals of the cells along each row of cells are connected together forming a continuous select gate line. The source regions of the cells along each row of cells are connected together forming a continuous source line. The drain regions of the cells along each column are connected to a bitline. The floating gate of each cell is from a first layer polysilicon, the program gate lines are from a second polysilicon layer, the select gate lines are from a third polysilicon layer, the source lines are diffusion lines, and the bitlines are from a first layer metal.

In another embodiment, the rows of cells are divided in a predesignated number of groups of rows, each group of rows forming a segment block, and the memory further includes a first plurality of vertically extending interconnect lines in each segment block, each of the first plurality of interconnect lines electrically connecting together the source lines within each segment block. The first plurality of interconnect lines are from first layer metal.

In another embodiment, the memory further includes a first horizontally extending interconnect line in each segment block, electrically connecting the first plurality of interconnect lines. Each of a second plurality of horizontally extending interconnect lines in each segment block electrically straps one or more of the program gate lines. The first horizontally extending interconnect line and the second plurality of interconnect lines are from second layer metal.

In another embodiment, every source line is located between two program gate lines, and the drain regions of every two adjacent cells along each column are connected to a bitline via a drain contact such that each row of drain contacts is located between two select gate lines.

In another embodiment, each cell is a split-gate triple-polysilicon cell.

In another embodiment, one or more cells are programmed by biasing the one or more cells so as to induce in each of the one or more cells injection of hot electrons from a source-side of a channel region to the floating gate.

In another embodiment, the rows of cells are divided into a predesignated number of groups of rows, and each group of rows forms a segment block. All cells in a first segment block are simultaneously erased by biasing the cells in the first segment block so as to induce in each cell tunneling of electrons from the floating gate to the source region.

In accordance with yet another embodiment of the present invention, a method of manufacturing a first and second semiconductor memory array configurations wherein each array configuration includes a plurality of memory cells arranged along rows and columns, each cell having a floating gate, a drain region, a source region, a program gate terminal, and a select gate terminal, includes the acts of: forming a plurality of rows of continuous program gate lines, each row of program gate line forming the program gate terminals of the cells along the row, the program gate lines being from a second layer polysilicon; forming a plurality of rows of continuous select gate lines, each row of select gate line forming the select gate terminals of the cells along the row, the select gate lines being from a third layer polysilicon; forming a plurality of rows of continuous source lines, each source line forming the source regions of the cells along the row, the source lines being from diffusion; wherein the first array configuration is obtained by: forming a plurality of local bitlines, the cells along each column being divided into a predesignated number of groups, the drain regions of the cells in each group being connected to one of the local bitlines extending across the cells in the group of cells; and forming a plurality of global bitlines along every two columns of cells, each global bitline being configured to selectively provide electrical connection to the local bitlines along the two columns of cells, wherein the local bitlines are from a first layer metal and the global bitlines are from a second layer metal.

In another embodiment, the second array configuration is obtained by forming a plurality of bitlines, the drain regions of the cells along each column being connected to one of the plurality of bitline, the bitlines being from a first layer, metal.

In another embodiment, the first array configuration the cells coupled to a row of local bitlines form a segment block, and the method further includes: forming a first plurality of interconnect lines in each segment block, each of the first plurality of interconnect lines electrically connecting together the source lines within each segment block; and forming a second plurality of interconnect lines in each segment block, each of the second plurality of interconnect lines electrically connecting the program gate lines within each segment block, wherein the first and second plurality of interconnect lines are from first layer metal.

In another embodiment, the method further includes: forming a first horizontally extending interconnect line in each segment block, the first interconnect line electrically connecting the first plurality of interconnect lines; and forming a second horizontally extending interconnect line in each segment block, the second interconnect line electrically connecting the second plurality of interconnect lines together, wherein the first and second horizontally extending interconnect lines are from first layer metal.

In another embodiment, the method further includes forming first and second rows of segment select transistors in each segment block, the first row of segment select transistors providing electrical connection between the global bitlines and one half of the local bitlines in the segment block when selected, and the second row of segment select transistors providing electrical connection between the global bitlines and the remaining half of the local bitlines in the segment block when selected.

Further features and advantages of the present invention will become more fully apparent from the following detailed description of the invention, the appended claims, and the accompanying drawings.

DESCRIPTION OF THE SPECIFIC EMBODIMENTS

In accordance with the present invention, a first array configuration is provided for digital storage, and a second array configuration is provided for analog storage, both array configurations being based on the same triple-polysilicon source-side injection split-gate non-volatile memory cell technology. This enables producing different non-volatile memory products for different types of applications while maintaining only one cell technology.

Use of the same cell for both the analog and digital arrays is made possible by the highly efficient programming characteristics of the source-side injection split-gate cell. Such high programming efficiency is needed in the analog storage array wherein high biasing precision and low programming current is needed in programming the cells.

Figure 1:
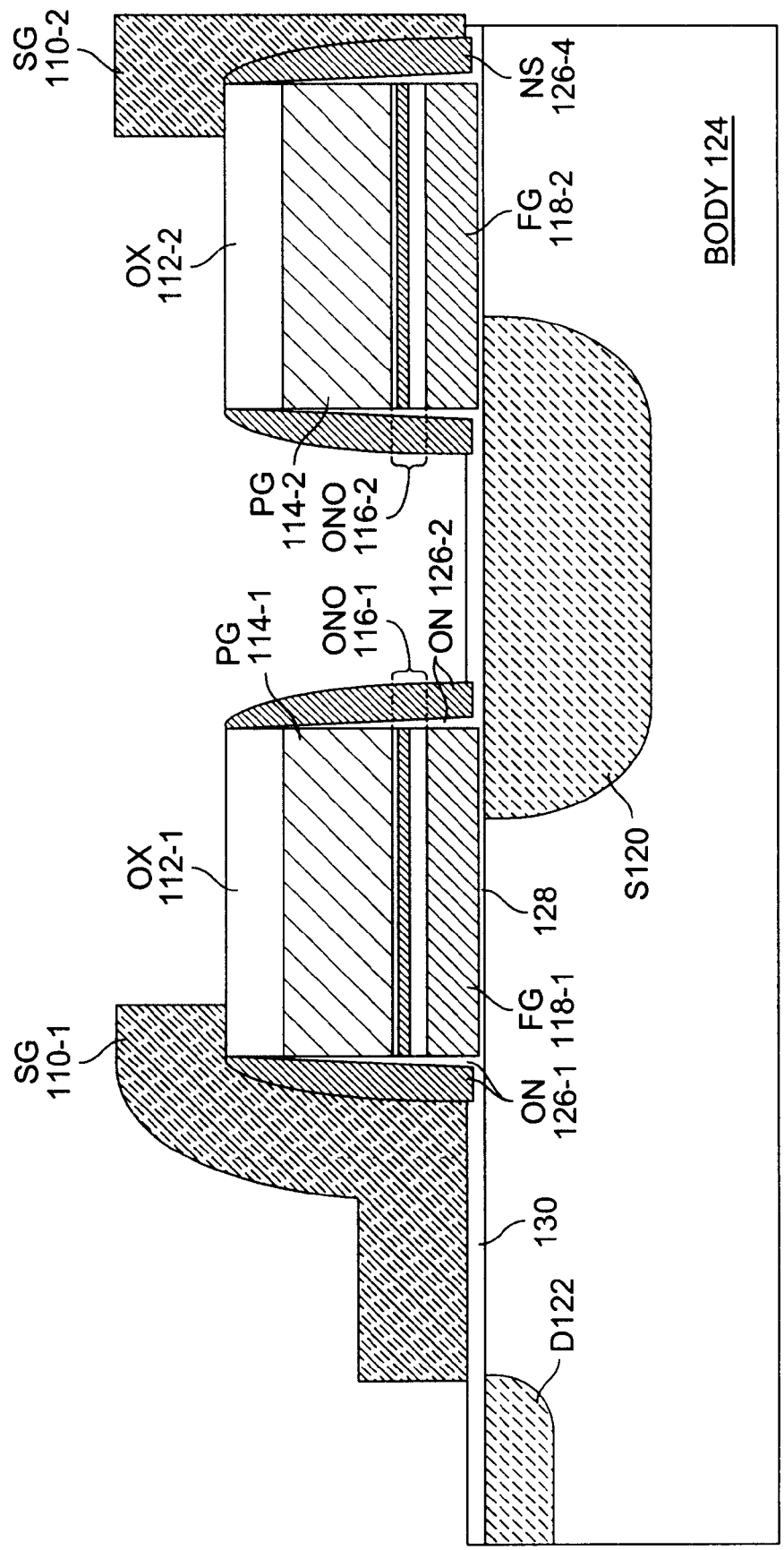
FIG. 1 shows a cross section view of two adjacent split gate triple-polysilicon source-side injection non-volatile memory cells.

FIG. 1 shows a cross section view of two adjacent split gate triple-polysilicon source-side injection non-volatile memory cells. Each cell includes a drain region D122 and a source region S120 in a body region 124, the source and drain regions being separated by a channel region. As shown, the S120 region is a deeper junction than the D122 region. A floating gate FG118 (first layer polysilicon) extends over a portion of the S120 region and a portion of the channel region adjacent to the S120 region. The floating gate FG118 is insulated from the underlying regions by a tunnel oxide layer 128.

A composite layer of oxide-nitride-oxide ONO116 extends over FG118, and a program gate PG114 (second layer polysilicon) extends over the ONO116. An oxide layer Ox112 overlies the PG114 layer. A composite oxide-nitride spacer ON126 extends along each sidewall of the FG118, PG114 stack. A select gate SG110 extends over a portion of the top oxide layer Ox112, and a second portion of the channel region. The SG110 is insulated from the underlying second portion of the channel region by an oxide layer 130. Other layers and structures, such as metal layer and contact, are not shown, but would be obvious to one skilled in this art.

Each select gate SG110 forms part of a select gate line extending perpendicularly to the FIG. 1 plane. Each program gate PG114 and source region S120 similarly forms parts of a program gate line and source line extending perpendicularly to the FIG. 1 plane. A metal bitline (not shown) contacts the drain regions D122 of cells along a column of cells, and thus extends parallel to the FIG. 1 plane. The triple-poly cell is programmed by inducing hot electron injection from the channel region to FG118, and is erased by inducing tunneling of electrons from FG118 to the source region S120.

Figure 2:
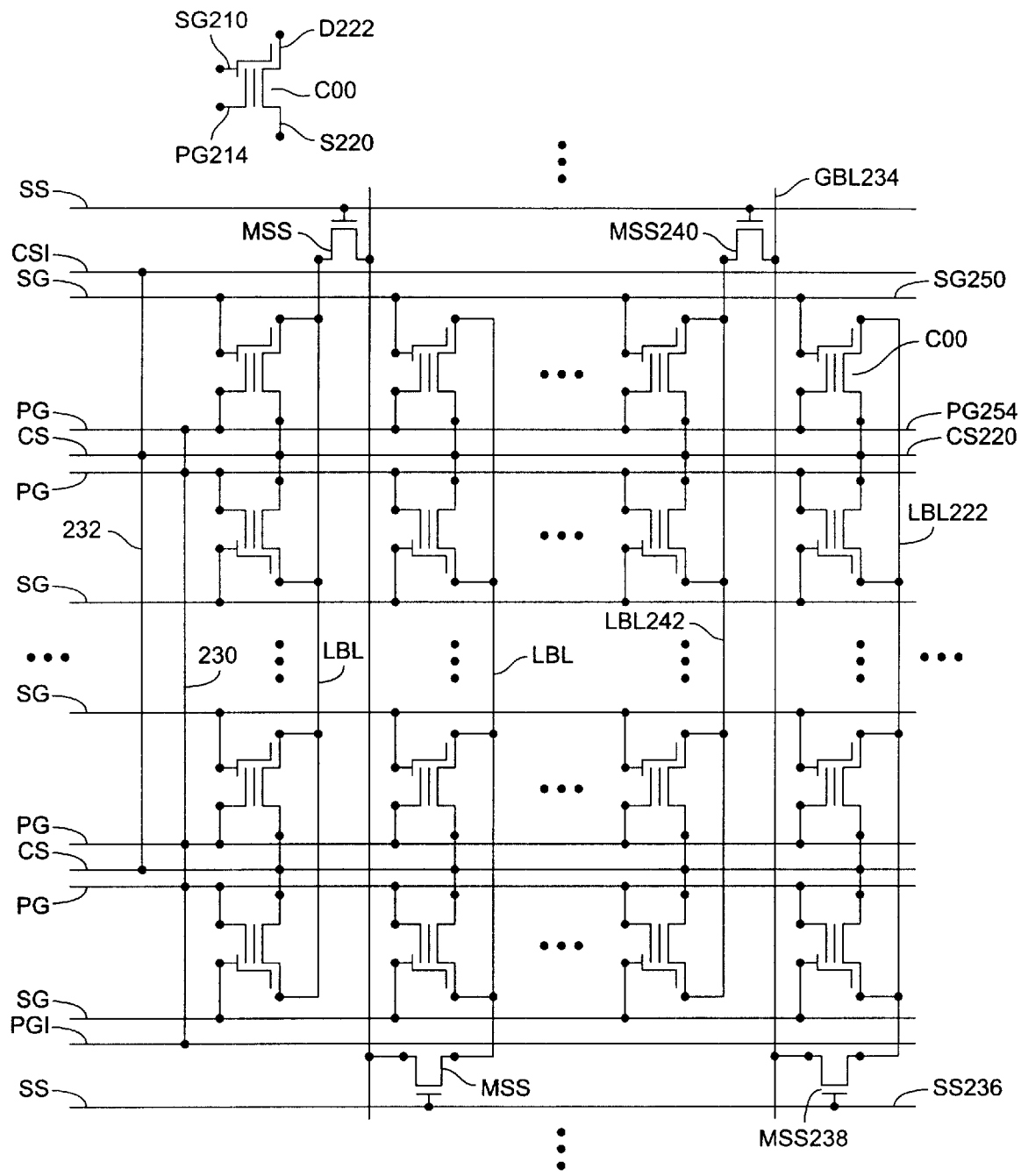
FIG. 2 is a circuit schematic illustrating a digital memory array configuration in accordance with one embodiment of the present invention.

FIG. 2 is a circuit schematic of a portion of a digital memory array configuration based on the FIG. 1 triple-poly cell, in accordance with an embodiment of the present invention. The memory cells are arranged along rows and columns. Each cell, for example cell C00 (also shown in the upper portion of FIG. 2), is schematically shown to have four terminals, drain D222, source S220, select gate SG210, and program gate PG214. The cells along each column are divided into groups, each group having an equal number of cells. The drain terminals of the cells in each group are connected to a local bitline LBL. A row of such LBL's forms a segment block. Each local bitline, e.g., LBL222, is in turn coupled to a global bitline, e.g., GBL234, through a segment select transistor, e.g., MSS238. For every two columns of cells, one global bitline GBL vertically extends across the entire array. Each GBL transfers data to or from the memory cells along the two corresponding columns of cells via the MSS transistors.

Such array configuration results in segmentation of the bitlines such that the effective bitline capacitance is reduced to the capacitance associated with the GBL line and the capacitance associated with the number of cells connected to a LBL. Such reduction in bitline capacitance improves the read performance of the memory device.

The source terminal, select gate terminal, and program gate terminal of the cells along each row are respectively connected to form a diffusion common source line, e.g., CS220, a polysilicon select gate line, e.g., SG250, and a polysilicon program gate line, e.g., PG254. As shown, each diffusion common source line CS is shared by two adjacent rows of cells. Also, the drain region between every two adjacent cells along each column is shared by the two adjacent cells, and a shared contact is used to make electrical contact between the shared drain region and the corresponding local bitline LBL.

In each segment block, one (or more) common source interconnect line(s) CSI electrically connects a predesignated number of the diffusion CS lines. CSI lines extend horizontally across the array, and vertically (see line 232) across one segment block only. Similarly, for each segment block, one (or more) program gate interconnect line(s) PGI electrically connects a predesignated number of the polysilicon PG lines. PGI lines extend horizontally across the array, and vertically (see line 230) across one segment block only. Accordingly, the CSI line connects the source terminals of all the cells in a segment block together, and the PGI line connects the program gate terminals of all the cells in a segment block together.

The MSS transistors in FIG. 2 are NMOS. However, PMOS transistors may be used instead depending on the type of cell used, the process technology, and other factors. For each segment block, the segment select transistors MSS are located along two rows, one on top of the segment block and one on the bottom. The gates of the MSS transistors along each row of such transistors are connected together to form a horizontally-extending segment select SS line. For example, the gates of the MSS transistors along the bottom row are connected together to form segment select line SS236.

As shown in FIG. 2, the top row of MSS transistors are used to couple the GBLs to the corresponding left LBLs, while the bottom row of MSS transistors are used to couple the GBLs to the corresponding right LBLs. For example, MSS240 along the top row couples GBL234 to LBL242 when turned on, and MSS238 along the bottom row of MSS transistors couples GBL234 to LBL222 when turned on. In an alternate embodiment, the two rows of MSS transistors are combined into one row so that a single SS line is used to select all the MSS transistors for a segment block.

A flash memory array is typically divided into a number of sectors, each sector having the same number of rows and columns of cells. For example, an array having 2,048 (2K) rows by 2,048 (2K) columns may be divided into eight sectors of 256 rows by 2K columns. During an erase operation, all cells within one or more of the sectors may be erased simultaneously. In the embodiment shown in FIG. 2, each segment block forms a sector, however, each segment block may be divided into two or more sectors by isolating CSI and PGI lines in each segment block.

The table blow shows the array biasing conditions in each of programming, read, and erase operations.

|  | Selected | | | | | Unselected | | | | |
| --- | --- | --- | --- | --- | --- | --- | --- | --- | --- | --- |
|  | SS | SG | PG | CS | BL | SS | SG | PG | CS | BL |
| Program | 5 V | 1.5–2 V | 8–12 V | 5 V | 0.5 V | 0 V | 0 V | 0 V | 0 V | VCC |
| Erase | 0 V | 0 V | –10 V | VCC/5 V | F | 0 V | 0 V | 0 V | 0 V | F |
| Read | VCC | VCC | VCC | 0 V | 1.2 V | 0 V | 0 V | VCC | 0 V/F | F |

During a programming operation, a predesignated number of cells are programmed by biasing the array as follows: the selected SS, SG, PG, CS, and BL lines are biased to 5V, 1.5–2V, 8–12V, 5V, and 0.5V, respectively; and the unselected SS, SG, PG, CS, and BL lines are biased to 0V, 0V, 0V, 0V, and VCC, respectively. Such biasing triggers source-side hot electron injection in the selected cells, thus programming the selected cells to a predesignated threshold voltage.

During an erase operation, one or more sectors are selected for erase by biasing the array as follows: the selected SS, SG, PG, CS, and BL lines are biased to 0V, 0V, –10V, VCC/5V, and float, respectively; and the unselected SS, SG, PG, CS, and BL lines are biased to 0V, 0V, 0V, 0V, and float, respectively. Such biasing induces tunneling of hot electrons from the floating gate to the source terminal of the cells in the selected sector(s), thus erasing the cells to a predesignated threshold voltage.

During a read operation, a predesignated number of cells are selected by biasing the array as follows: the selected SS, SG, PG, CS, and BL lines are biased to VCC, VCC, VCC, 0V, and 1.2V, respectively; and the unselected SS, SG, PG, CS, and BL lines are biased to 0V, 0V, VCC, 0V/float, and float, respectively. The content of each selected cell causes the voltage on the corresponding local and global bitlines to move from the 1.2V to a first voltage if the cell is in a programmed state, and to a second voltage if the cell is in an erased state.

Figure 3:
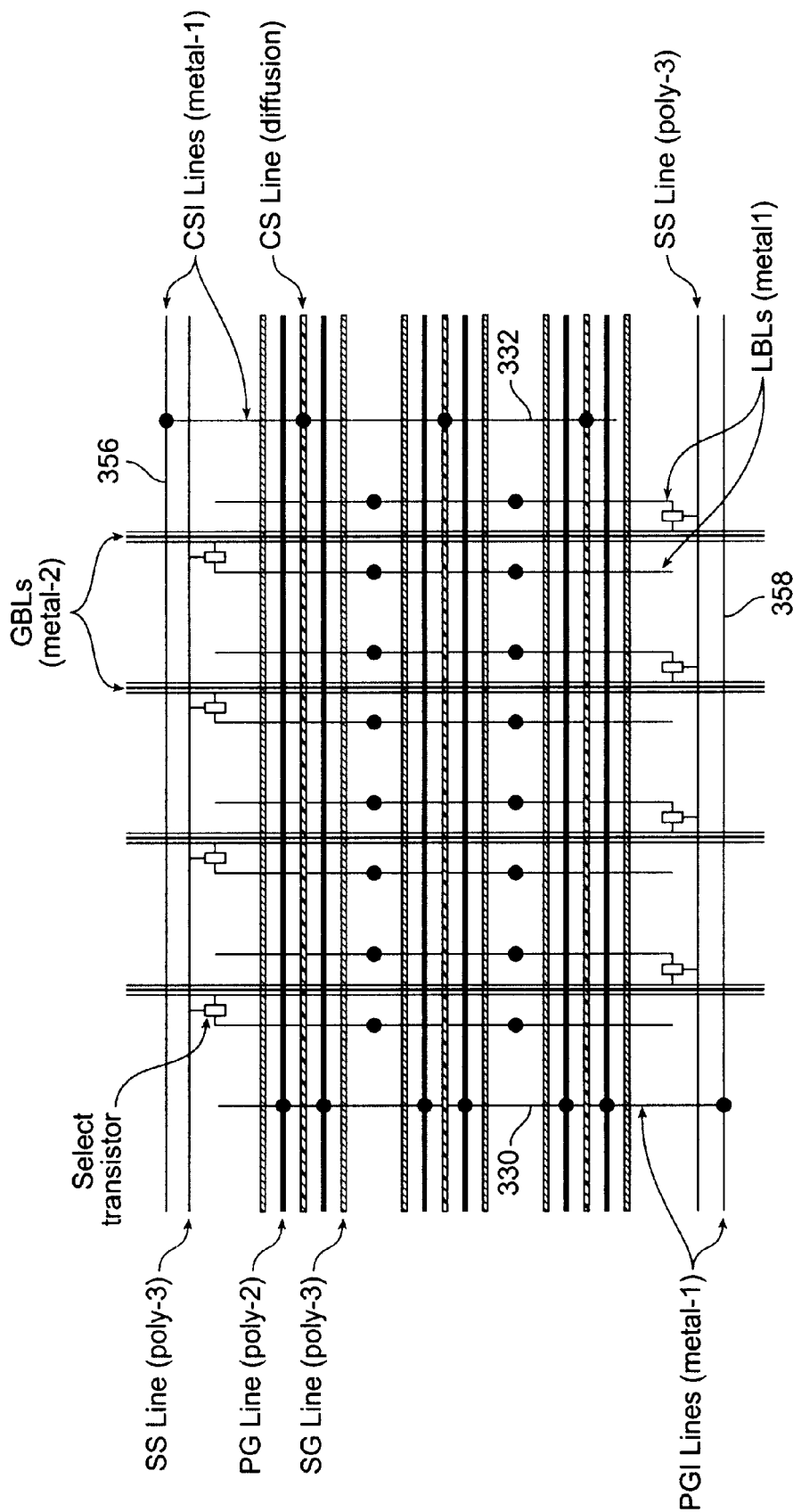
FIG. 3 shows a busing configuration in the array corresponding to FIGS. 1 and 2, in accordance with one embodiment of the present invention.

FIG. 3 shows an array busing arrangement corresponding to FIGS. 1 and 2, in accordance with one embodiment of the present invention. As shown, the source CS lines (faded cross-hatched lines), program gate PG lines (Solid bolded lines), select gate SG lines (comb-like lines), and segment select SS lines (solid lines) extend horizontally, while the global bitlines GBL (triple solid lines) and the local bitlines LBL (solid lines) extend vertically. Each circular dot represents a contact. The contacts on the LBLs are to provide electrical connection between the LBL and the underlying drain region. Each contact is shared by two vertically adjacent cells. The drain regions are sandwiched between two SG lines. Each CS line is sandwiched by two PG lines.

In one embodiment wherein a triple-polysilicon double-metal process technology is used, the floating gates are from first layer polysilicon, the PG lines are from second layer polysilicon, the SG and SS lines are from third layer polysilicon with polycid to minimize the wordline RC, the CS lines are diffusion lines, the LBLs are from first layer metal, and the GBLs are from second layer metal.

As in FIG. 2, two rows of select transistors MSS connect the LBLs to the GBLs. The rows of cells between every two rows of MSS transistors form a segment block. All diffusion CS lines in each segment block are connected together via a first layer metal (metal-1) interconnect CSI line 332 extending vertically. A number of such vertical CSI lines may be used in each segment block to minimize the resistance associated with the diffusion CS lines. The number of vertical CSI lines is dependent on the cell tolerance and the performance criteria. In one embodiment, one vertical CSI line is used every 16 or 32 cells. All vertical CSI lines are connected together by a horizontally extending metal-1 line 356 extending along the outer perimeter of the segment block.

All poly-2 PG lines in each segment block are connected together via a metal-1 interconnect PGI line 330 extending vertically. One or more such vertical PGI lines may be used in each segment block. Since poly-2 PG lines are not performance-critical (i.e., signals on PG lines are not switched during read operations), fewer number of vertical PGI lines may be used. In one embodiment, one vertical PGI line is used every 64 or 128 cells. All vertical PGI lines are connected together by a horizontally extending metal-1 line 358 extending along the outer perimeter of the segment block.

The FIG. 3 busing configuration yields a high performance memory because, the resistance of the diffusion source lines is reduced by using metal CSI lines 332, 356, and bitline capacitance is reduced to that of the local bitlines plus the corresponding GBL. This is achieved by using only two layers of metal. Further, no disturb conditions are present in the array during programming, erase, or read operations.

In another embodiment wherein the polycide process is not available, metal-1 is used to strap the SG lines in order to minimize the wordline RC. Metal-0, which is a variation of the tungsten plug, is used for the LBL's and for PGI line 330 and CSI line 332. Metal-1 may also be used to strap the polysilicon PG lines and diffusion CS lines.

Figure 4:
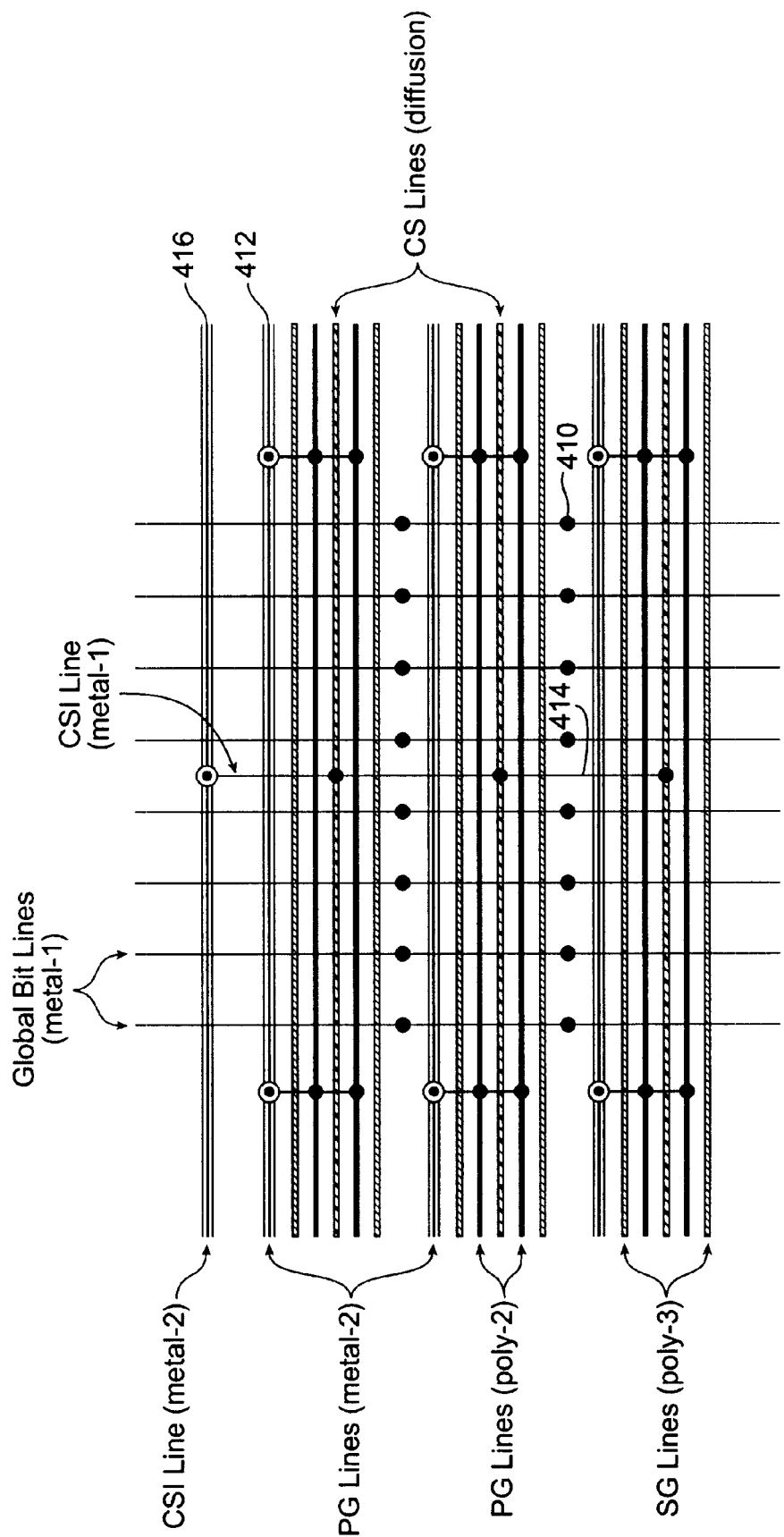
FIG. 4 shows a bussing configuration for an analog array using the triple-poly cell of FIG. 1, in accordance with another embodiment of the present invention.

Another array busing configuration using the triple-poly cell of FIG. 1 is shown in FIG. 4 in accordance with another embodiment of the present invention. This array configuration is suitable for analog storage applications such as voice recording. The FIG. 1 cell as used in the array configurations shown in FIGS. 2 and 3 arrays has only two digital states, an erased state and a programmed state. In contrast, the FIG. 1 cell as used in the FIG. 4 array is capable of storing analog information. In one embodiment, the cell is capable of storing 256 states (e.g., threshold voltage levels), thus enabling storing 8 bits of information.

The storage of multiple bits is achieved by carefully controlling the array biasing during programming. In programming a cell to a target threshold voltage level, an iterative program-verify routine is used. In the iterative routine, the cell is programmed a little at a time, and verified after every programming step to determine whether its threshold voltage has reached the target level. This operation requires that within the allotted time, the selected PG lines be brought to within 10 mV or less of the desired voltage level.

In FIG. 4, the source CS lines (faded cross-hatched lines), program gate PG lines (solid bolded lines), and select gate SG lines (comb-like lines) extend horizontally, and a plurality of global bitlines GBL (solid lines) extend vertically. Each circular dot represents a regular contact, and each circular dot within another circle represents a via contact. As is well known in the art, via contacts are used for providing electrical connection between two adjacent overlying metal layers, while a regular contact is used to provide electrical connection between other layers of material. The regular contacts, e.g., contact 410, provide electrical connection between the GBLs and the underlying drain regions. Each contact is shared by two vertically adjacent cells. The drain regions are sandwiched between two SG lines. Each CS line is sandwiched by two PG lines.

In a triple-polysilicon double-metal process, the PG lines are from second layer polysilicon, the SG lines are from third layer polysilicon with polycid to minimize the wordline RC, the CS lines are diffusion lines, and the GBLs are from first layer metal. The rows of cells are divided in a predesignated number of groups, each group forming a segment block. All diffusion CS lines in each segment block are connected together via a first layer metal (metal-1) interconnect CSI line 414 extending vertically. A number of such vertical CSI lines may be used in each segment block to minimize the resistance associated with the diffusion CS lines. The number of vertical CSI lines is dependent on the cell tolerance and the performance criteria. Because of the required precision in biasing the cells during programming, it is important to minimize the source resistance. In one embodiment, one vertical CSI line is used every 16 or 32 cells. All vertical CSI lines are connected together by a horizontally extending metal-2 line 416.

Figure 5:
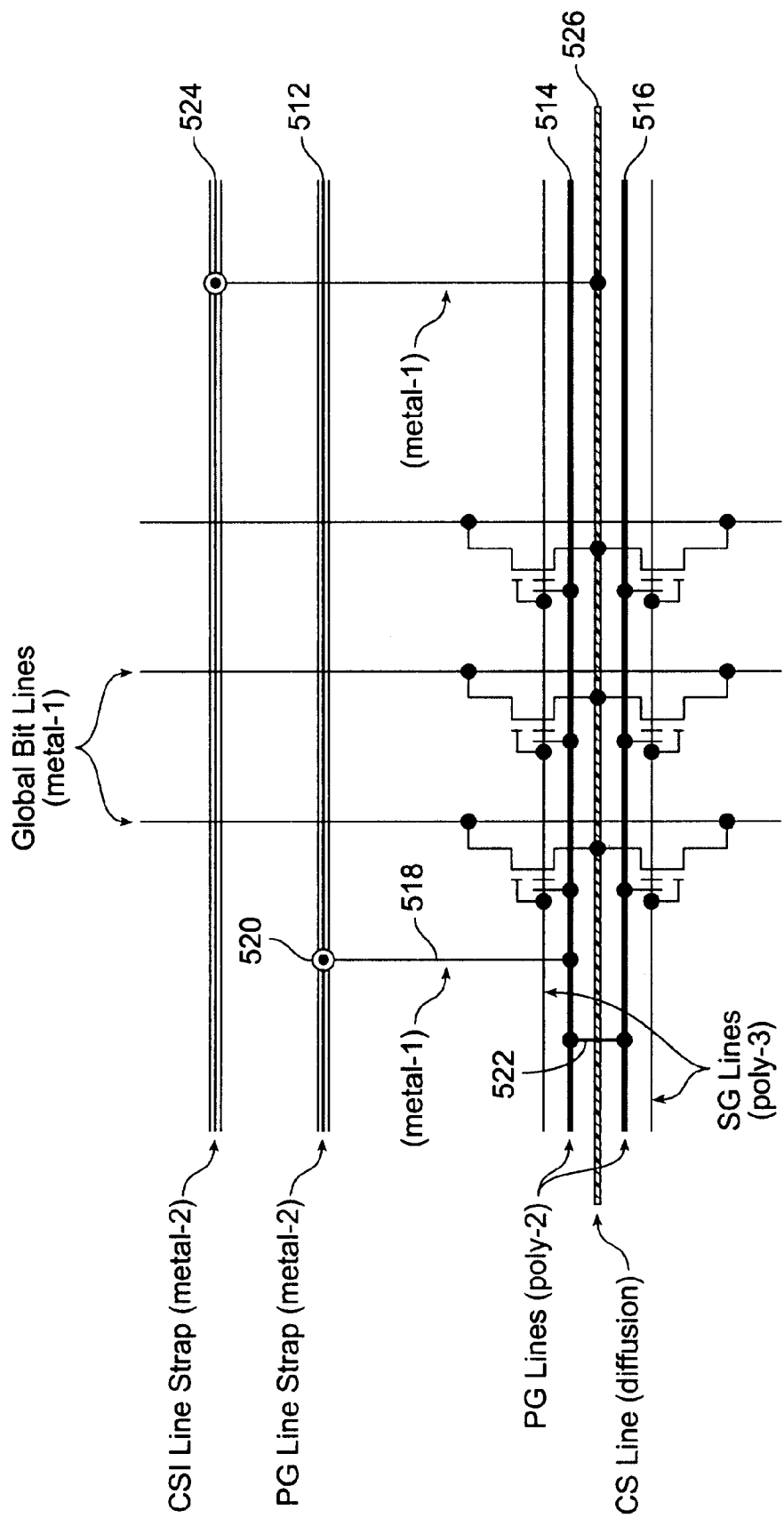
FIG. 5 is a more detailed drawing of a portion of the FIG. 4 bussing configuration.

Because of the high precision needed in controlling the voltage on the PG lines during programming, the polysilicon PG lines are strapped with a second layer metal (metal-2). FIG. 5 more clearly shows the manner in which the PG lines are strapped with metal-2. As shown in FIG. 5, every two adjacent polysilicon PG lines, e.g., lines 514, 516, are shorted together through a poly-2 link, e.g., link 522, and are strapped with one metal-2 PG line, e.g., line 512, using for example metal-1 line 518 and via contact 520. The number of via contacts along each PG line is dependent on the performance requirements. In one embodiment, a via contact is used every 16 or 32 or 64 cells. In another embodiment, all PG lines in a segment block are connected together. In another embodiment, each PG metal-2 strap line extends on top of the two PG lines which it straps.

In both read and programming operations, multiple bits in the array are accessed simultaneously. In a read operation, multiple bits are read from the array, although fewer bits at a time are output from the memory device. In one embodiment, a page (row) of cells is read, and held in temporary storage locations outside of the array, and the data is then serially transferred from the temporary storage locations to one or more output pins. In a programming operation, a number of data bits are serially transferred from one or more output pins to the temporary storage locations. The data bits in the storage locations are then programmed into a row of cells simultaneously.

The array biasing conditions during program, erase and read operations are summarized in the table below.

|  | Selected | | | | Unselected | | | |
|---|---|---|---|---|---|---|---|---|
|  | SG | PG | CS | BL | SG | PG | CS | BL |
| Program | 2.2 V | 6–12 V | 5 V | sink 1uA | 0 V | 0 V | 0 V | VCC |
| Erase | 0 V | −10 V | 5 V | F | 0 V | 0 V | 0 V | F |
| Read | 4.2 V | 2.3 V | 2.3 V | sink 1uA | 0 V | 0 V | 0 V | VCC |

During a programming operation, a predesignated number of cells are programmed by biasing the array as follows: the selected SG and CS lines are biased to 2.2V and 5V respectively, the selected PG line is set to a voltage between 6V–12V depending on the desired programming threshold voltage, and the programming current provided through the selected bitlines is limited to 1 uA. Such low programming current is made possible by the high programming efficiency of the source-side injection cell. The unselected SG, PG, CS, and BL lines are biased to 0V, 0V, 0V, and VCC, respectively. Such biasing triggers source-side hot electron injection in the selected cells, thus programming the selected cells to a predesignated threshold voltage. As indicated earlier, an iterative program-verify sequence of operations are carried out to program the cells to the desired threshold voltage level.

During an erase operation, one or more sectors are erased by biasing the array as follows: the selected SG, PG, CS, and BL lines are biased to 0V, −10V, 5V, and float, respectively; and the unselected SG, PG, CS, and BL lines are biased to 0V, 0V, 0V, and float, respectively. Such biasing induces electron tunneling in the cells of the selected sector(s), thus erasing the cells in a sector to a predesignated threshold voltage.

During a read operation, a predesignated number of cells are read by biasing the array as follows: the selected SG, PG, CS lines are biased to 4.2V, 2.3V, 2.3V, respectively, and the data in the selected cells are read by sensing the corresponding bitline voltages while sinking 1 uA of current from each of the selected cells. The unselected SG, PG, CS, BL lines are biased to 0V, 0V, 0V, VCC, respectively.

As can be seen, the two arrays of FIGS. 3 and 4 although use the same cell structure, are configured differently. The array of FIG. 3 is intended for such applications as PC BIOS, while the array of FIG. 4 is intended for such applications as voice recording.

The above description is illustrative and not restrictive. For example, the array biasing voltages and currents provided in the tables above are illustrative only, and depending on the cell technology and device requirements, the biasing can be changed as is well known by one skilled in this art. The scope of the invention should, therefore, be determined not with reference to the above description, but instead with reference to the appended claims along with their full scope of equivalents.

What is claimed is:

1. A semiconductor memory comprising:
   a plurality of memory cells arranged along rows and columns, each cell having a floating gate, a drain region, a source region, a program gate terminal, and a select gate terminal, the program gate terminals of the cells along each row of cells being connected together forming a continuous program gate line extending parallel to the rows of cells, the select gate terminals of the cells along each row of cells being connected together forming a continuous select gate line extending parallel to the rows of cells, the source regions of the cells along each row of cells being connected together forming a continuous source line extending parallel to the rows of cells, the cells along each column being divided into a predesignated number of groups, the drain regions of the cells in each group being connected to a local bitline extending across the cells in the group of cells, the cells coupled to a row of local bitlines forming a segment block;
   a global bitline extending along every two columns of cells, configured to selectively provide electrical connection to the local bitlines along the corresponding two columns of cells; and
   a first plurality of interconnect lines extending perpendicularly to the rows of cells in each segment block, each of the first plurality of interconnect lines electrically connecting together the source lines within each segment block.

2. The semiconductor memory of claim 1 wherein the local bitlines are from a first layer metal and the global bitlines are from a second layer metal.

3. The semiconductor memory of claim 1 further comprising:
   a second plurality of interconnect lines extending perpendicularly to the rows of cells in each segment block, each of the second plurality of interconnect lines electrically connecting the program gate lines within each segment block,
   wherein the first and second plurality of interconnect lines are from first layer metal.

4. The semiconductor memory of claim 3 further comprising:
   a first interconnect line extending parallel to the rows of cells in each segment block, the first interconnect line electrically connecting the first plurality of interconnect lines; and
   a second interconnect line extending parallel to the rows of cells in each segment block, the second interconnect line electrically connecting the second plurality of interconnect lines together,
   wherein the first and second interconnect lines extending parallel to the rows of cells are from first layer metal.

5. The semiconductor memory of claim 1 wherein each segment block has first and second rows of segment select transistors, the first row of segment select transistors providing electrical connection between the global bitlines and one half of the local bitlines in the segment block when selected, and the second row of segment select transistors providing electrical connection between the global bitlines and the remaining half of the local bitlines in the segment block when selected.

6. The semiconductor memory of claim 5 wherein a gate terminal of each of the segment select transistors in the first row of segment select transistors are connected together forming a first continuous segment select line, and a gate terminal of each of the segment select transistors in the second row of segment select transistors are connected together forming a second continuous segment select line.

7. The semiconductor memory of claim 1 wherein each segment block has one row of segment select transistors configured to provide electrical connection between the global bitlines and the local bitlines within the segment block when selected.

8. The semiconductor memory of claim 7 wherein a gate terminal of each of the segment select transistors in the row of segment select transistors are connected together forming a continuous segment select line, the segment select lines being from third layer polysilicon.

9. The semiconductor memory of claim 1 wherein a first layer metal straps the select gate lines, and the local bitlines are from a tungsten plug layer.

10. The semiconductor memory of claim 9 wherein the first layer metal straps the source lines.

11. The semiconductor memory of claim 1 wherein every source line is located between two program gate lines, and the drain regions of every two adjacent cells in each of the groups of cells are connected to a local bitline via a drain contact such that each row of drain contacts is located between two select gate lines.

12. The semiconductor memory of claim 1 wherein each cell is a split-gate triple-polysilicon cell.

13. The semiconductor memory of claim 12 wherein one or more cells are programmed by biasing the one or more cells so as to induce in each of the one of more cells injection of hot electrons from a source-side of a channel region to the floating gate.

14. The semiconductor memory of claim 12 wherein the rows of cells are divided in a predesignated number of groups of rows, each group of rows forming a segment block, all cells in a first segment block being simultaneously erased by biasing the cells in the first segment block so as to induce in each cell tunneling of electrons from the floating gate to the source region.

15. The semiconductor memory of claim 1 wherein in each cell:
   the drain region and source region form a channel region therebetween,
   the floating gate extends over but is insulated from a portion of the source region and a first portion of the channel region,
   the program gate extends over but is insulated from the floating gate, and
   the select gate extends over but is insulated from a portion of the floating gate and a second portion of the channel region.

16. The semiconductor memory of claim 15 wherein each cell further comprises an oxide-nitride bilayer along the sidewalls of the stack of floating gate and program gate, the nitride layer forming the outside layer of the oxide-nitride bilayer.

17. The semiconductor memory of claim 15 wherein the floating gate is insulated from the underlying regions by a tunnel oxide layer, the program gate is insulated from the underlying floating gate by a composite oxide-nitride-oxide layer, and the select gate is insulated from each of the portion of the floating gate and the second portion of the channel region by an oxide layer.

18. A semiconductor memory comprising:
   a plurality of memory cells arranged along rows and columns, each cell having a floating gate, a drain region, a source region, a program gate terminal, and a select gate terminal, the program gate terminals of the cells along each row of cells being connected together forming a continuous program gate line extending parallel to the rows of cells, the select gate terminals of the cells along each row of cells being connected together forming a continuous select gate line extending parallel to the rows of cells, the source regions of the cells along each row of cells being connected together forming a continuous source line extending parallel to the rows of cells, the drain regions of the cells along each column being connected to a bitline, wherein the rows of cells are divided in a predesignated number of groups of rows, each group of rows forming a segment block; and
   a first plurality of interconnect lines extending perpendicularly to the rows of cells in each segment block, each of the first plurality of interconnect lines electrically connecting together the source lines within each segment block.

19. The semiconductor memory of claim 18 wherein the first plurality of interconnect lines are from metal.

20. The semiconductor memory of claim 18 further comprising:
   a first interconnect line extending parallel to the rows of cells in each segment block, electrically connecting the first plurality of interconnect lines; and
   a second plurality of interconnect lines extending parallel to the rows of cells in each segment block, each of the second plurality of interconnect lines electrically strapping one or more of the program gate lines,
   wherein the first interconnect line extending parallel to the rows of cells and the second plurality of interconnect lines are from metal.

21. The semiconductor memory of claim 20 wherein each of the second plurality of interconnect lines straps the one or more program gate lines through contact vias and first layer metal.

22. The semiconductor memory of claim 18 wherein every source line is located between two program gate lines, and the drain regions of every two adjacent cells along each column are connected to a bitline via a drain contact such that each row of drain contacts is located between two select gate lines.

23. The semiconductor memory of claim 18 wherein each cell is a split-gate triple-polysilicon cell.

24. The semiconductor memory of claim 23 wherein one or more cells are programmed by biasing the one or more cells so as to induce in each of the one or more cells injection of hot electrons from a source-side of a channel region to the floating gate.

25. The semiconductor memory of claim 23 wherein the rows of cells are divided into a predesignated number of groups of rows, each group of rows forming a segment block, all cells in a first segment block being simultaneously erased by biasing the cells in the first segment block so as to induce in each cell tunneling of electrons from the floating gate to the source region.

* * * * *